US009884766B2

(12) United States Patent
Buckland et al.

(10) Patent No.: US 9,884,766 B2
(45) Date of Patent: Feb. 6, 2018

(54) TREATING PARTICLES

(71) Applicant: PERPETUUS RESEARCH & DEVELOPMENT LIMITED, London (GB)

(72) Inventors: John Buckland, London (GB); Dylan Walters, London (GB)

(73) Assignee: PERPETUUS RESEARCH & DEVELOPMENT, LTD., London (GB)

(*) Notice: Subject to any disclaimer, the term of this patent is extended or adjusted under 35 U.S.C. 154(b) by 0 days.

(21) Appl. No.: 14/539,553

(22) Filed: Nov. 12, 2014

(65) Prior Publication Data

US 2015/0135993 A1    May 21, 2015

(30) Foreign Application Priority Data

Nov. 12, 2013  (GB) .................................. 1319951.8
Dec. 20, 2013  (GB) .................................. 1322764.0

(51) Int. Cl.
*H01H 1/46*        (2006.01)
*B05D 7/00*        (2006.01)
(Continued)

(52) U.S. Cl.
CPC ......... *C01B 31/0484* (2013.01); *B01J 19/087* (2013.01); *B01J 19/126* (2013.01);
(Continued)

(58) Field of Classification Search
CPC .......... H01J 37/32018; H01J 37/32192; H01J 37/32229; H01J 37/32568;
(Continued)

(56) References Cited

U.S. PATENT DOCUMENTS 3,282,814 A * 11/1966 Berghaus .................. C23C 8/36
                                                        118/303
3,325,393 A *  6/1967 Darrow ................. C23C 14/022
                                                    148/DIG. 169
(Continued)

FOREIGN PATENT DOCUMENTS

DE       19502187 A    1/1995
DE       19502187 A1   1/1996
(Continued)

OTHER PUBLICATIONS

Webster'S Ninth New Collegiate Dictionary; Merriam-Webster incorporated, publishers; Springfield, Massachusetts, USA; 1990 (no month), excerpt p. 331.*
(Continued)

*Primary Examiner* — Marianne L Padgett
(74) *Attorney, Agent, or Firm* — Quarles & Brady LLP

(57) ABSTRACT

A method of treating particles by disaggregating, deagglomerating, exfoliating, cleaning, functionalizing, doping, decorating and/or repairing said particles, in which the particles are subjected to plasma treatment in a treatment chamber containing a plurality of electrodes which project therein and wherein plasma is generated by said electrodes which are moved during the plasma treatment to agitate the particles.

15 Claims, 7 Drawing Sheets

(51) Int. Cl.

| | | |
|---|---|---|
| C01B 31/04 | (2006.01) | |
| C23C 16/509 | (2006.01) | |
| C23C 16/517 | (2006.01) | |
| B01J 19/08 | (2006.01) | |
| B01J 19/12 | (2006.01) | |
| B08B 6/00 | (2006.01) | |
| C08K 9/00 | (2006.01) | |
| C23C 16/26 | (2006.01) | |
| C23C 16/44 | (2006.01) | |
| C23C 16/511 | (2006.01) | |
| C23C 16/513 | (2006.01) | |
| H01J 37/02 | (2006.01) | |
| H01J 37/32 | (2006.01) | |
| C09C 1/46 | (2006.01) | |
| H05H 1/46 | (2006.01) | |
| C01B 32/168 | (2017.01) | |
| C01B 32/19 | (2017.01) | |
| C01B 32/194 | (2017.01) | |

(52) U.S. Cl.
CPC .............. *B08B 6/00* (2013.01); *C01B 32/168* (2017.08); *C01B 32/19* (2017.08); *C01B 32/194* (2017.08); *C08K 9/00* (2013.01); *C09C 1/46* (2013.01); *C23C 16/26* (2013.01); *C23C 16/4417* (2013.01); *C23C 16/509* (2013.01); *C23C 16/511* (2013.01); *C23C 16/513* (2013.01); *C23C 16/517* (2013.01); *H01J 37/023* (2013.01); *H01J 37/32018* (2013.01); *H01J 37/32192* (2013.01); *H01J 37/32568* (2013.01); *H05H 1/46* (2013.01); *B01J 2219/0809* (2013.01); *B01J 2219/0818* (2013.01); *B01J 2219/0824* (2013.01); *B01J 2219/0879* (2013.01); *B01J 2219/0894* (2013.01); *B01J 2219/1206* (2013.01); *C01P 2004/03* (2013.01); *H05H 2001/4697* (2013.01)

(58) Field of Classification Search
CPC ....... H01J 2237/3321; H01J 2237/3323; H01J 2237/335; H01J 2237/336; H01J 2237/338; C23C 16/26; C23C 16/4417; C23C 16/505; C23C 16/509; C23C 16/517; B01J 19/087; B01J 19/126; B01J 2219/0879; B01J 2219/0894; B01J 2219/0896; B01J 2219/1206; B01J 2219/0807–2219/0813; B01J 2219/0816; B01J 2219/0818; B01J 2219/0824; B01J 2219/0847; C01B 31/0423; C01B 31/0438; C01B 31/0469; C01B 31/0484; C01B 31/0492; C01B 31/0253; C09C 1/44; C09C 1/46; H05H 1/46; H05H 2001/4607–2001/4697
USPC ........ 427/213, 242, 240, 488–491, 523–531, 427/534–539, 562–564, 569–579; 118/716, 723 E, 730, 731; 216/67–71
See application file for complete search history.

(56) References Cited

U.S. PATENT DOCUMENTS

| | | | | |
|---|---|---|---|---|
| 3,738,828 | A * | 6/1973 | Inoue | B22F 1/0081 134/1 |
| 3,960,544 | A * | 6/1976 | Tylko | C22B 4/005 75/10.22 |
| 4,859,493 | A * | 8/1989 | Lemelson | B01J 8/42 118/50.1 |
| 5,340,618 | A * | 8/1994 | Tanisaki | B01J 8/18 427/212 |
| 5,476,826 | A * | 12/1995 | Greenwald | B01J 21/18 502/101 |
| 5,623,180 | A * | 4/1997 | Jin | H01J 9/025 313/309 |
| 6,015,597 | A * | 1/2000 | David | B01J 2/006 427/122 |
| 6,649,217 | B1 | 11/2003 | Gust | |
| 7,128,816 | B2 * | 10/2006 | Denes | A01N 1/02 204/164 |
| 8,784,949 | B2 * | 7/2014 | Reichen | H05H 1/42 118/716 |
| 2001/0050056 | A1 * | 12/2001 | France | C04B 41/009 118/716 |
| 2002/0037320 | A1 * | 3/2002 | Denes | A01N 1/02 424/489 |
| 2009/0200180 | A1 * | 8/2009 | Capote | C02F 1/4608 205/744 |
| 2010/0278919 | A1 * | 11/2010 | Denes | A61K 39/00 424/489 |
| 2011/0039036 | A1 * | 2/2011 | Reichen | H05H 1/42 427/569 |
| 2012/0145041 | A1 * | 6/2012 | Walters | B01J 19/088 106/472 |
| 2013/0320274 | A1 * | 12/2013 | Walters | B01J 19/088 252/511 |
| 2014/0048411 | A1 | 2/2014 | Choi et al. | |
| 2014/0248442 | A1 * | 9/2014 | Luizi | C01B 31/0273 427/569 |
| 2017/0174520 | A1 * | 6/2017 | Walters | C01B 31/0446 |
| 2017/0179477 | A1 * | 6/2017 | Walters | H01M 4/366 |

FOREIGN PATENT DOCUMENTS

| | | | | |
|---|---|---|---|---|
| WO | WO 2010/142953 A1 * | 12/2010 | ............ | B01J 19/088 |
| WO | 2012076853 A | 6/2012 | | |
| WO | 2012076853 A1 | 6/2012 | | |

OTHER PUBLICATIONS

Machine translation (description & claims) of DE 19502187 A1, published Aug. 1, 1996 by Alexander Kruse et al.*
Search Report dated Mar. 6, 2014 in connection with GB1322764.0.
Search Report dated Oct. 31, 2014 in connection with GB1322764.0.
Cheng, et al., "Restoration of graphene from graphene oxide by defect repair", Carbon, vol. 50, Jun. 7, 2012, pp. 2581-2587, available online Feb. 14, 2012.
Meng Cheng, et al, Restoration of graphene from graphene oxide by defect repair; Carbon 50 (2012) pp. 2581-2587; doi:10.1016/j.carbon.2012.02.016 Elsevier Ltd. available online Feb. 14, 2012.
International Searching Authority, Notification of Transmittal of the International Search Report and the Written Opinion of the International Searching Authority or the Declaration in the matter of PCT/GB2014/053352; dated Feb. 16, 2015. EPO, Netherlands.

* cited by examiner

TREATING PARTICLES

CROSS-REFERENCE TO RELATED APPLICATIONS

This application claims priority to United Kingdom Patent Application No. 1319951.8 filed Nov. 12, 2013 and United Kingdom Patent Application No. 1322764.0 filed Dec. 20, 2013, both of which are incorporated herein by reference for all purposes.

FIELD OF THE INVENTION

This invention relates to an apparatus and method for treating particles and to particles produced by said method with particular, but by no means exclusive, reference to the treatment of nanoparticles. The invention relates also to methods of repairing defects in fullerene or graphene containing nanoparticles.

BACKGROUND OF THE INVENTION

The last quarter of a century has seen remarkable advances in the field of nano-particles, including carbon or carbon containing nanoparticles. Reference is made to hitherto undiscovered allotropes of carbon such as various fullerenes, including carbon nanotubes (CNTs). Reference is also made to graphene, which is a single layer of graphite, and also to graphene containing nanoparticles such as graphene nano platelets (GNPs). There is a huge amount of interest in graphene and graphite-based materials in view of their remarkable electrical, thermal, mechanical and physical properties. Already, a huge amount of effort and expense has been put into the development of these materials and the exploitation of the remarkable properties. However, there are problems in manufacturing CNTs and graphene based materials, particularly for large-scale industrial applications. Furthermore, there are problems in handling these materials. The problems have so far been a barrier to commercial-level exploitation of materials such as CNTs and graphene based materials.

More specifically, it is well-known to synthesise CNTs and graphene containing materials such as GNP at low temperature using methods such as arc discharge and Catalytic Chemical Vapour Deposition (CCVD). It is also known to use acid intercalation of graphites, and to produce graphene from graphene oxide by thermal annealing, chemical, photocatalytic and plasma reduction. All of these methods, to a greater or lesser extent, offer a potential for relatively large-scale production. However, all of these methods result in an abundance of defects and disorder in the CNT and graphene containing products which are introduced by processes such as oxidation and exfoliation. Once synthesised, these problems are further compounded as conventional manipulation of graphenes and CNTs into a practical, useful material involves harsh, intensive mechanical and chemical processing. This further processing again degrades the surface of the material by generating additional defect sites. This occurrence is a common event irrespective of whether the materials produced are in sheet form, tubular (such as CNTs), or in other structural forms such as bucky balls, nano onions, or other graphene containing structures. The defects and disorders introduced by these prior art techniques severely degrade the materials' usefulness in any of the wide range of end applications which might be envisaged, such as use as a material enhancing filler, or as a facilitating component within any one of the wide range of devices for sensing, catalysis, or other high value end applications.

Additionally, many of the particles, such as CNTs, are difficult to handle and to produce in an acceptable state owing to their very pronounced tendency to aggregate or agglomerate under the influence of van der Waals' forces. The inherently high "specific surface area" of nanoparticles, together with (for structures such as CNTs) a high aspect ratio, exacerbates this tendency.

It is known to treat and/or produce nanoparticles such as CNTs and graphene platelets using a glow discharge plasma. Apparatus suitable to perform such treatments are disclosed in International Publications WO2010/142953 and WO2012/076853, the entire contents of both of which are herein incorporated by reference. However, WO2010/142953 and WO2012/076853 are not believed to be compatible with optimised large scale production. More specifically, it would be highly desirable to provide improvements in large scale production parameters such as processing efficiency and throughput. Furthermore, it would be highly desirable to provide an improved apparatus which can produce nanoparticles having better properties and characteristics, such as highly crystalline nanoparticles and nanoparticles having a reduced tendency to aggregate or agglomerate. Yet further, it would be highly desirable to provide apparatus and methods which enable novel and improved particles, including nanoparticles, to be produced.

SUMMARY OF THE INVENTION

The present invention, in at least some of its embodiments, is directed to one or more of the problems and desires disclosed above. Although it pertains particularly to nanoparticles, the invention is not limited in this regard. Rather, apparatus and methods of the invention can also be used to advantage in the treatment of non-nanoparticles, such as fibres of various kinds, for example, carbon fibres and polymeric fibres.

According to a first aspect of the invention, there is provided a method of treating particles by disaggregating, deagglomerating, exfoliating, cleaning, functionalising, doping, decorating and/or repairing said particles, in which the particles are subjected to plasma treatment in a plasma chamber containing a plurality of electrodes which project therein, and wherein plasma is generated by said electrodes which are moved during the plasma treatment to agitate the particles.

The particles treated may be graphite particles. For example, graphite particles may be exfoliated to produce graphene containing particles. The graphite particles may be exfoliated to produce graphene containing nanoparticles, preferably graphene nanoplatelets (GNPs).

The particles treated may be nanoparticles. Nanoparticles as defined herein are particles having a characteristic dimension less than 1000 nm, preferably 100 nm or smaller. Typically, the characteristic dimension is 1 nm or greater. It is understood that the characteristic dimension is often a diameter, a width or thickness, and the nanoparticle may have another, major dimension which exceeds 100 nm or even 1000 nm. The nanoparticles may be carbon nanoparticles. The carbon nanoparticles may be fullerenes. The carbon nanoparticles may be carbon nanotubes (CNTs). CNTs may be single walled or multi-walled CNTs. The carbon nanoparticles may be graphene containing nanoparticles such as GNPs. GNPs are small stacks of graphene. The platelet thickness is typically less than 100 nm, generally less than 70 nm, preferably less than 50 nm, more preferably less than 30 nm, and most preferably less than 15 nm. The platelet thickness is generally more than 1 nm. Often, the GNP platelet thickness is in the range 5-10 nm, but different thicknesses are possible. Typically, a sample of GNP produced or treated with the invention will exhibit a range of thicknesses. The major dimension of the GNP is typically at least 10 times, often at least 100 times, and preferably at least 1000 times the thickness. Representative major dimensions range from sub-micron to 100 microns.

Alternatively, the particles treated may be non-nanoparticles. In general, the major dimensions of such particles are all in excess of one micron. Where the particles treated are non-nanoparticles, the particles may be fibres such as carbon fibres and polymeric fibres. Examples of polymeric fibres are polyamide fibres and polyester fibres.

Advantageously, glow discharge plasma is generated by the electrodes. Plasmas of this type are convenient to implement and have been found to produce good results.

Generally speaking, glow discharge plasma is a low pressure plasma. The pressure in the treatment chamber to generate the glow discharge plasma is typically 10 Torr (1430 Pa) or less. Preferably, the pressure in the treatment chamber is 5 Torr (670 Pa) or less, more preferably 1 Torr (130 Pa) or less, more preferably still, 0.5 (67 Pa) Torr or less, and most preferably 0.1 Torr (13 Pa) or less. The pressure in the treatment chamber is typically 0.001 Torr (0.13 Pa) or greater, and often 0.01 Torr (1.3 Pa) or greater. For the avoidance of doubt, ranges of treatment chamber pressures corresponding to all possible combinations of these upper and lower pressure limits are within the scope of the invention.

In general, the glow discharge plasma is formed by the passage of electric current through a low-pressure gas.

The glow discharge plasma may be formed using DC, AC or RF voltages. DC, AC or RF power may be applied to each of the plurality of electrodes which project in the treatment chamber in order to generate the plasma. The glow discharge plasma may be continuous or pulsed. The plurality of electrodes can be considered to be working electrodes, and generally a counter-electrode is present, which may be an interior wall of the treatment chamber. Alternatively, or additionally, conductive particles present in the treatment chamber may act as a counter-electrode.

Although it is preferred to use glow discharge plasma, it is possible to generate other types of plasma with the electrodes. For example, atmospheric plasmas, near atmospheric plasmas, or plasmas utilising pressures up to several atmospheres might be utilised. Alternatively, other forms of low pressure plasma might be used.

Advantageously, plasma is formed in a localised region around each electrode. In combination with the use of the electrodes to agitate the particles during the plasma treatment, this feature enables the interaction between the plasma and the particles to be well controlled. It can also enable advantageous processing conditions to be created and controlled.

In general, a gas or a gaseous mixture is introduced into the chamber to sustain the plasma as is well-known in the art of plasma processing. In the present invention, the gas or gaseous mixture may be introduced from each electrode. The gas or gaseous mixture may be introduced from one or more apertures disposed in each electrode. In some embodiments, the electrodes are needle type electrodes. The gas or gaseous mixture may be introduced from an end of each electrode, although additionally, or alternatively, the gas or gas mixture could be introduced from a number of apertures disposed along the length of the electrode.

The invention provides numerous ways in which particles can be treated. These are discussed below.

i) Disaggregation and Deagglomeration

The invention can be used to disaggregate and/or deagglomerate particles. "Sticky" nanoparticles such as CNTs, GNPs, and other graphene containing nanoparticles may be disaggregated and/or deagglomerated. Particles treated in this way can be disbursed more readily and more homogeneously in a containment medium such as a liquid or a matrix. This can give rise to enhanced properties and is useful in end applications such as the production of filler materials.

ii) Exfoliation

The invention can be used to exfoliate a first set of particles to give rise to a second set of particles. In principle, the second set of particles may be size reduced equivalents of the first set of particles. Advantageously, the second set of particles may be different to the first set of particles. For example, graphite particles may be exfoliated in order to produce graphene containing particles, which may be graphene containing nanoparticles such as GNPs.

iii) Cleaning

It is often important to perform an effective cleaning step in order to produce a pure product and/or a product having a well-defined and possibly enhanced set of characteristics. Cleaning may be performed in order to remove physisorbed and/or chemisorbed species. An oxygen plasma is often an efficient way of cleaning the particles, although other cleaning plasmas may be contemplated, such as plasmas utilising other oxygen containing gases and/or mixtures with inert gases.

iv) Functionalisation and Doping

The present invention permits ready plasma functionalisation of the particles. The functionalisation can be performed in order to tailor the chemical and/or physical properties of the particles. For example, mechanical and barrier properties can be improved. Examples of functionalisation include the formation of carboxyl, carbonyl, hydroxyl, amine, amide, or halogen functionalities on the surfaces of the particles. Doping can be performed to introduce dopants into the bulk structure of the particles. The particles may be doped with an analyte species. The plasma may be generated using suitable precursor gases or gaseous mixtures which include one or suitable precursor gases. Suitable precursor gases include oxygen, water, hydrogen peroxide, alcohol such as methanol, nitrogen, ammonia, organic amines, halogens such as fluorine and chlorine, and halogenated hydrocarbons, including per-halogenated hydrocarbons such as $CF_4$.

v) Decoration

The treatment may be performed to decorate the surface of the particles with a decoration material. The decoration material may be a metal. The metal may be silver, platinum or gold.

vi) Repair

Advantageously, the present invention may be used to repair the particles. The repair may include or consist of repairing defects such as mono or multiple vacancies formed by the loss of one or more atoms from the structure of the particles.

Defect repair can result when the particles being treated are carbon nanoparticles, preferably fullerenes such as CNTs and graphene containing nanoparticles such as GNPs. Repair of carbon particles which are not nanoparticles is also possible.

The plasma treatment may be a plasma enhanced chemical vapour deposition (PECVD) process.

When the objective is repair of the particles, plasma may be generated in a carbon containing gas or a gaseous mixture including a carbon containing gas. The carbon containing gas may be a hydrocarbon, an alcohol, or a halocarbon. Examples of suitable gases include methane, methanol and carbon tetrachloride. Carbon monoxide and carbon dioxide are further candidates. In one preferred embodiment, the plasma is generated in pure methane or in a gaseous mixture which consists essentially of methane.

For the avoidance of doubt, the term 'gas' as used herein includes any substance introduced to the plasma in gaseous form, including the gaseous component of a volatile liquid such as carbon tetrachloride.

Advantageously, particles may be introduced into the treatment chamber and a plurality of methods in accordance with the invention may be performed as part of a single, combined treatment process. An individual method step of the invention which forms part of the combined treatment process may be performed on the particles which were introduced into the treatment chamber, or on particles which are different to the particles which are initially introduced into the treatment chamber and which are products resulting from one or more earlier treatment methods.

Thus, the invention includes treatment processes in which:

i) particles in the treatment chamber undergo a first method in accordance with the first aspect of the invention; and ii) after the commencement of step i) and while remaining in the treatment chamber, the particles or particles produced by step i) undergo one or more further methods in accordance with the first aspect of the invention.

The first method may be one of disaggregating, deagglomerating, exfoliating or cleaning.

The further method or methods may include one or more of repairing, functionalising, doping and decorating.

Preferably, however, the treatment process includes both cleaning and repairing. Advantageously, the treatment process may include cleaning, repairing and one or both of functionalising and decorating.

With graphene containing nanoparticles, the treatment process may include the steps of exfoliating, cleaning and repairing, optionally with one or both of functionalising and decorating.

The electrodes may be moved at a speed that is varied during the course of the plasma treatment so as to control the interaction between the plasma generated by the electrodes and the particles. The plasma generated by the electrodes contains particles and photons of high energy which are utilised by the invention to perform useful steps such as disaggregation, deagglomeration, exfoliation, cleaning, functionalisation, doping and decorating. However, the plasma also has the capability of damaging the particles, for example by causing unwanted defects or even destroying part or all of the particles. Unwanted interactions of this type can be avoided or at least reduced by varying the speed at which the electrodes are moved during the course of the plasma treatment. For example, with graphene containing particles, it may be desirable during a cleaning process to avoid unwanted generation of defects, unwanted functionalisation and even possible destruction of graphene layers by increasing the speed at which electrodes are moved. This has the effect of physically transporting the graphene containing particles to regions away from the plasma, thereby reducing these detrimental effects.

The treatment chamber may contain a plurality of scoops which are moved during the plasma treatment to displace particles away from the plasma. The scoops may form part of or may be attached to at least some of the electrodes. This constitutes another way in which the interaction between the plasma generated by the electrodes and the particles can be controlled. For example, the particles can be physically transported to regions of the treatment chamber away from the plasmas in order to avoid detrimental effects associated with the interaction between the plasma generated by the electrodes in the particles.

A further way in which the interaction between the plasma generated by the electrodes and the particles may be controlled is by varying the power supplied to the electrodes during the course of the treatment.

Preferably, at least a portion of the treatment chamber is rotated thereby causing the electrodes to move during the plasma treatment. Preferably, the entire treatment chamber is rotated, such as by utilising a rotating drum as the treatment chamber.

Following the plasma treatment using plasma generated by the electrodes, a particulate product of said plasma treatment is produced. This particulate product may undergo a further treatment using a microwave induced plasma. The treatment chamber may be provided with microwave means to generate the microwave induced plasma. Alternatively, the further treatment may take place in a second chamber.

Following the plasma treatment using plasma generated by the electrodes, a particulate product of said plasma treatment may be transferred from the treatment chamber to a second chamber where the particulate product undergoes a finishing treatment. The finishing treatment may be a plasma treatment, such as a microwave induced plasma treatment. The second chamber may be moved during the finishing treatment to agitate the particulate product, such as by rotating the second chamber.

The finishing treatment may be a high temperature processing treatment. The finishing treatment may be performed to decorate the particulate product.

Where the finishing treatment is a plasma treatment, the gases discussed herein as possible plasma gases in relation to the plasma treatment using plasma generated by the electrodes may be used as the plasma gas for the finishing treatment.

According to a second aspect of the invention, there is provided apparatus for treating particles. The apparatus may be for treating particles in a method according to the first aspect of the invention. The apparatus may include a treatment chamber containing a plurality of electrodes which project therein, each electrode for generating a plasma, in which said electrodes are moveable to agitate particles disposed in the treatment chamber. Typically, at least a portion of the treatment chamber is rotatable thereby to cause the electrodes to move thereby agitating particles disposed in the treatment chamber. Advantageously, the entire treatment chamber is rotatable.

The apparatus may further include means for rotating the treatment chamber at a controllable speed.

In a preferred embodiment, the treatment chamber is a drum. The treatment chamber may have a longitudinal axis. The treatment may be rotatable about the longitudinal axis. The plurality of electrodes may be radially disposed around the longitudinal axis.

Typically, the electrodes project into the treatment chamber from an end wall thereof.

Three or more electrodes may project into the treatment chamber. In some embodiments, five or more electrodes project into the treatment chamber. Preferably, between three and twenty electrodes project into the treatment chamber. For the avoidance of any doubt, the statement "between three and twenty" includes embodiments in which there are three electrodes which project into the treatment chamber and also embodiments in which there are twenty electrodes which project into the treatment chamber.

According to a third aspect of the invention, there is provided a method of repairing defects in fullerene or graphene containing nanoparticles in which said nanoparticles are subjected to a plasma treatment, wherein a plasma is formed in a carbon containing gas or a gaseous mixture containing a carbon containing gas, the carbon containing gas being present in an amount sufficient to repair defects in said nanoparticles.

The plasma treatment may be a plasma-enhanced chemical vapour deposition (PECVD) process. The carbon containing gas may be a hydrocarbon, an alcohol, or a halocarbon. Examples of suitable carbon containing gases are methane, methanol, and carbon tetrachloride. Carbon monoxide and carbon dioxide are also suitable candidates.

In a preferred embodiment, the plasma is formed in pure methane or a gaseous mixture which contains essentially of methane.

The nanoparticles may be CNTs or GNPs.

The method of repairing defects may be performed in accordance with the first aspect of the invention. However, other plasma treatments utilising differently configured treatment chambers may be contemplated. For example, a microwave discharge plasma may be used.

According to a fourth aspect in the invention, there is provided particles obtained by a method according to the first aspect of the invention.

According to a fifth aspect of the invention there is provided a composite material including particles according to the fourth aspect of the invention dispersed in a matrix material. The matrix material may be a polymer. The polymer may be thermoset polymer or a thermoplastic. The polymer may be synthetic or a natural polymer such as a biopolymer. The polymer may be an epoxy-based polymer, a polyolefin such as polyethylene or polypropylene, polyurethane, polyester, polyamide, an acrylic polymer or a methacrylic polymer. The polymer may be a homopolymer or a co-polymer of suitable type.

The use of the particles in the product of a composite material can result in enhanced mechanical properties. Other advantageous properties which can be exhibited by composite materials of the invention include at least one of:
i) improved Tg;
ii) improved fire retardancy;
iii) improved barrier properties; for example resistance to liquid and/or gas ingress;
iv) shielding against electromagnetic interference such as RF interference; and
v) dissipation of electrostatic charge.

According to a sixth aspect of the invention there is provided a particle dispersion including particles of the fourth aspect of the invention dispersed in a liquid medium.

According to a seventh aspect of the invention there is provided an article including particles of the fourth aspect of the invention. The article may be a device.

Whilst the invention has been described above, it extends to any inventive combination of the features set out above, or in the following description, drawings or claims. For example, any feature described in relation to one aspect of the invention is considered to be disclosed also in relation to any other aspect of the invention.

BRIEF DESCRIPTION OF THE DRAWINGS

Embodiments of apparatus and methods in accordance with the invention will now be described with reference to the accompanying drawings, in which.

DETAILED DESCRIPTION OF THE INVENTION

Figure 1:
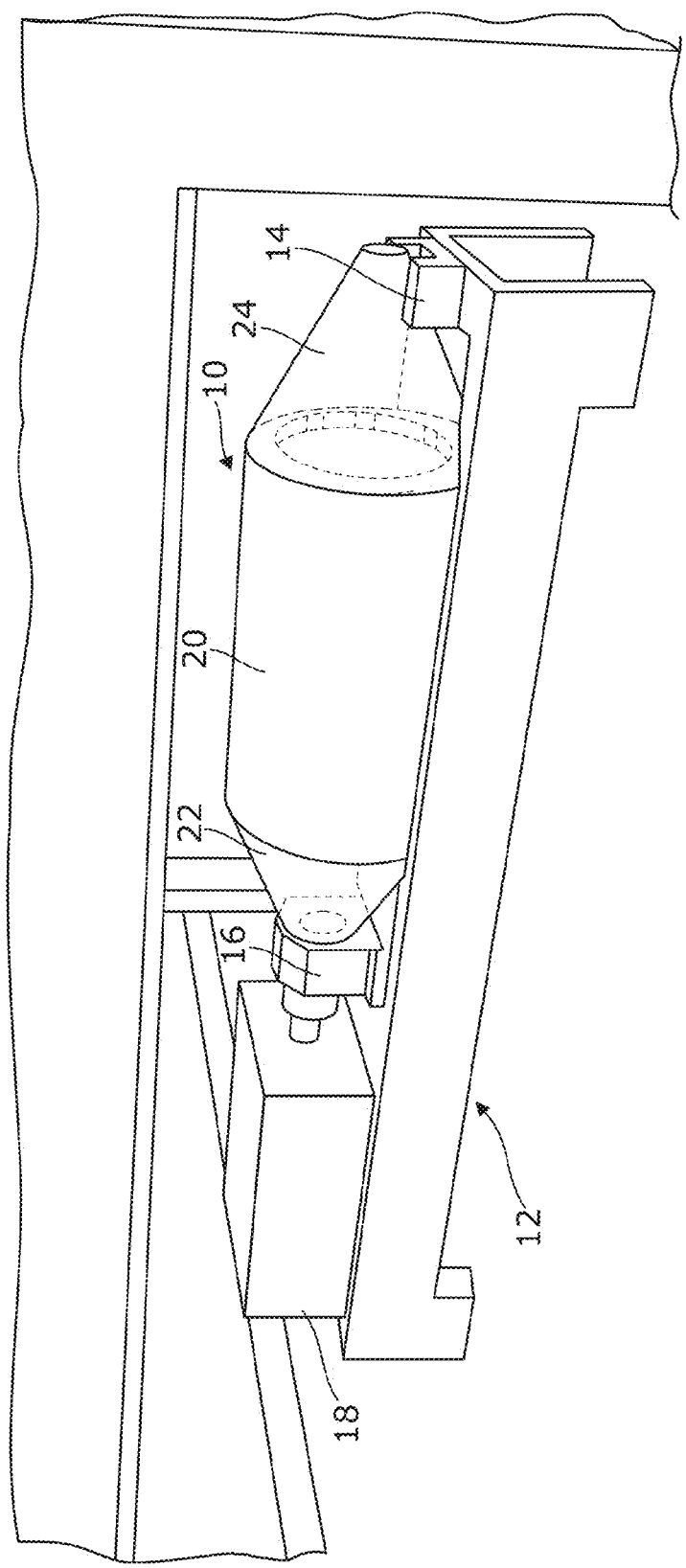
FIG. 1 is a perspective view of apparatus of the invention.

FIG. 1 shows a treatment chamber 10 of the invention positioned on a bed 12 through coupling portions 14, 16. The coupling portion 16 is in operative connection with a suitable motor or actuator disposed in a housing 18. The motor or actuator is coupled to the treatment chamber 10 so that, in operation, the treatment chamber 10 may be rotated at a desired rotational speed.

The treatment chamber 10 is a three-part modular arrangement comprising a central drum 20 and first and second frusto-conical sections 22, 24. The first frusto-conical section 22 is in contact with the receiving portion 16, and second frusto-conical section 24 is in contact with the receiving portion 14 so as to allow the treatment chamber 10 to be rotated. The drum 20 and first and second frusto-conical sections 22, 24 can be formed from any suitable material, such as stainless steel.

Figure 2:
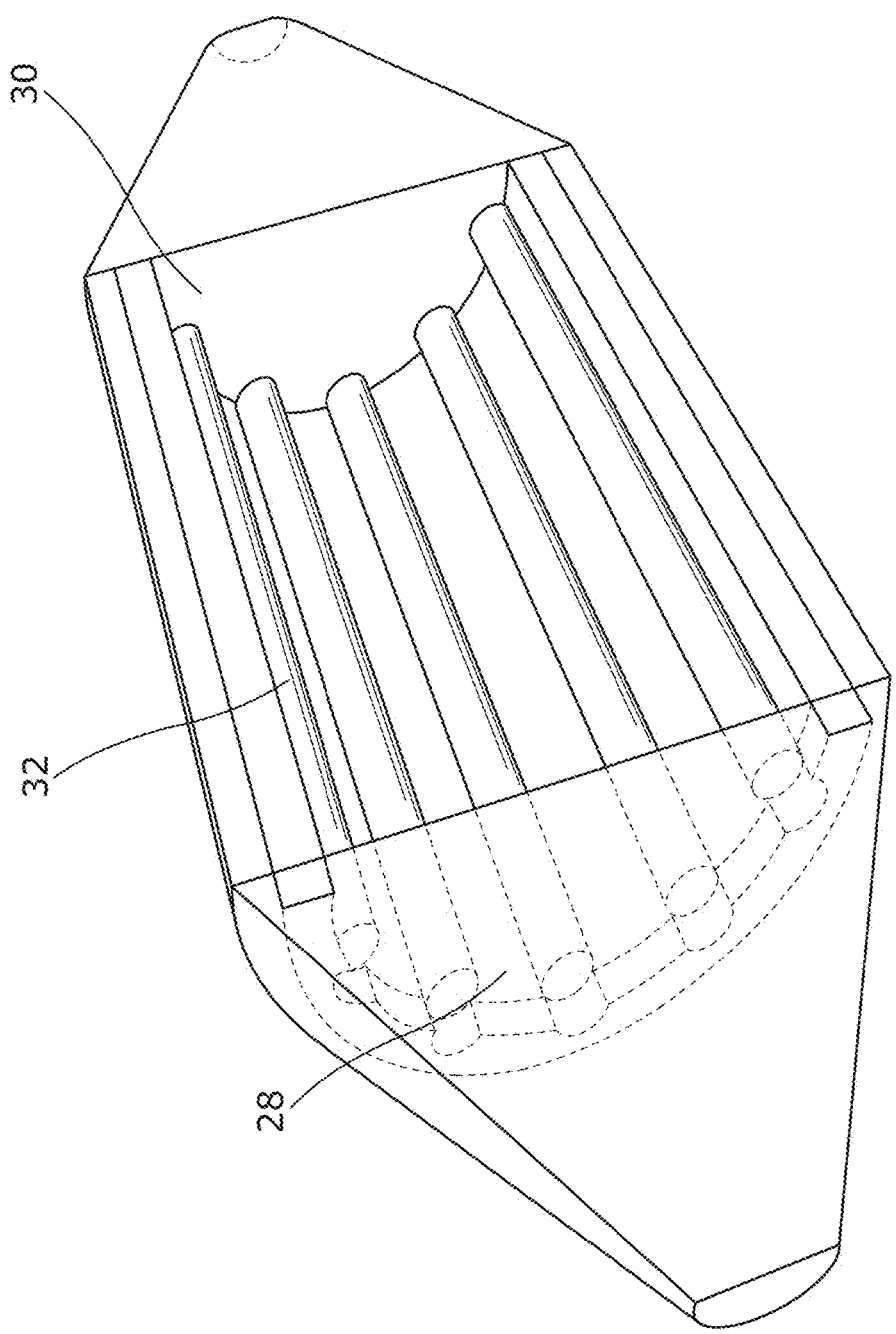
FIG. 2 is a partially cutaway perspective view of a rotating drum of the invention.
Figure 3:
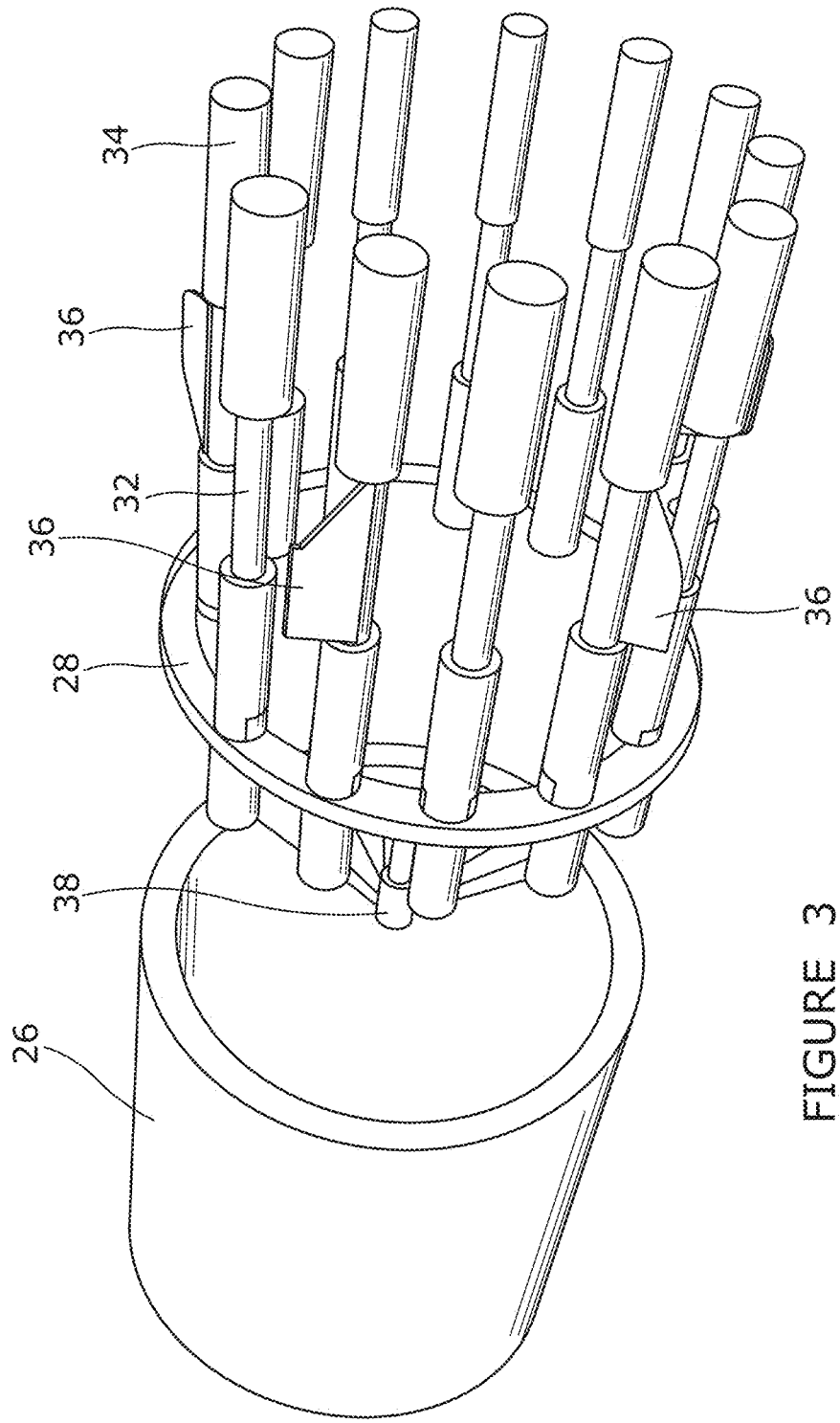
FIG. 3 is an exploded view of the interior of the rotating drum.

FIGS. 2 and 3 show the internal arrangement of the drum 20 in more detail. In particular, the drum 20 comprises a cylindrical portion 26 and first and second circular end plates 28, 30. The first end plate 28 is in communication with the first frusto-conical section 22 and the second end plate 30 is in communication with the second frusto-conical section 24. A plurality of electrodes 32 project out of the first end plate 28 into the interior of the drum 20. The electrodes 28 are radially disposed around the longitudinal axis of the drum 20 in a circular pattern. As shown in FIG. 3, the electrodes are equally spaced, although it is not critical that this is so. The electrodes 28 are arranged towards the circumferential edge of the first end plate 28. As explained in more detail below, this arrangement is preferred in order to provide agitation of particles which are disposed in the treatment chamber in order to undergo plasma treatment. In the embodiment shown in the figures, an arrangement of twelve electrodes project into the treatment chamber. However, a greater or a lesser number of electrodes might be used. In general, it is envisaged that between three and twenty electrodes will be suitable for most applications. However, a smaller number of electrodes or a larger number of electrodes might be used. The skilled reader will be able to readily determine the number of electrodes and the shape of the electrodes which are suitable for any given application. In the embodiment shown in the figures, the electrodes 32 are formed from an electrically conductive material such as stainless steel. Isolator sleeves 34 formed from an electrically insulating material such as ceramic are disposed at both ends of each electrode 32. The sleeves may be coatings on the electrodes. The electrodes should generally be arranged to project a significant way into the chamber. It is possible in other embodiments for them to extend between the end plates. The active plasma producing areas of the electrodes may be coated with a conductive ceramic coating such as boron silicate glass. This can act to reduce unwanted sputtering.

Figure 4A:
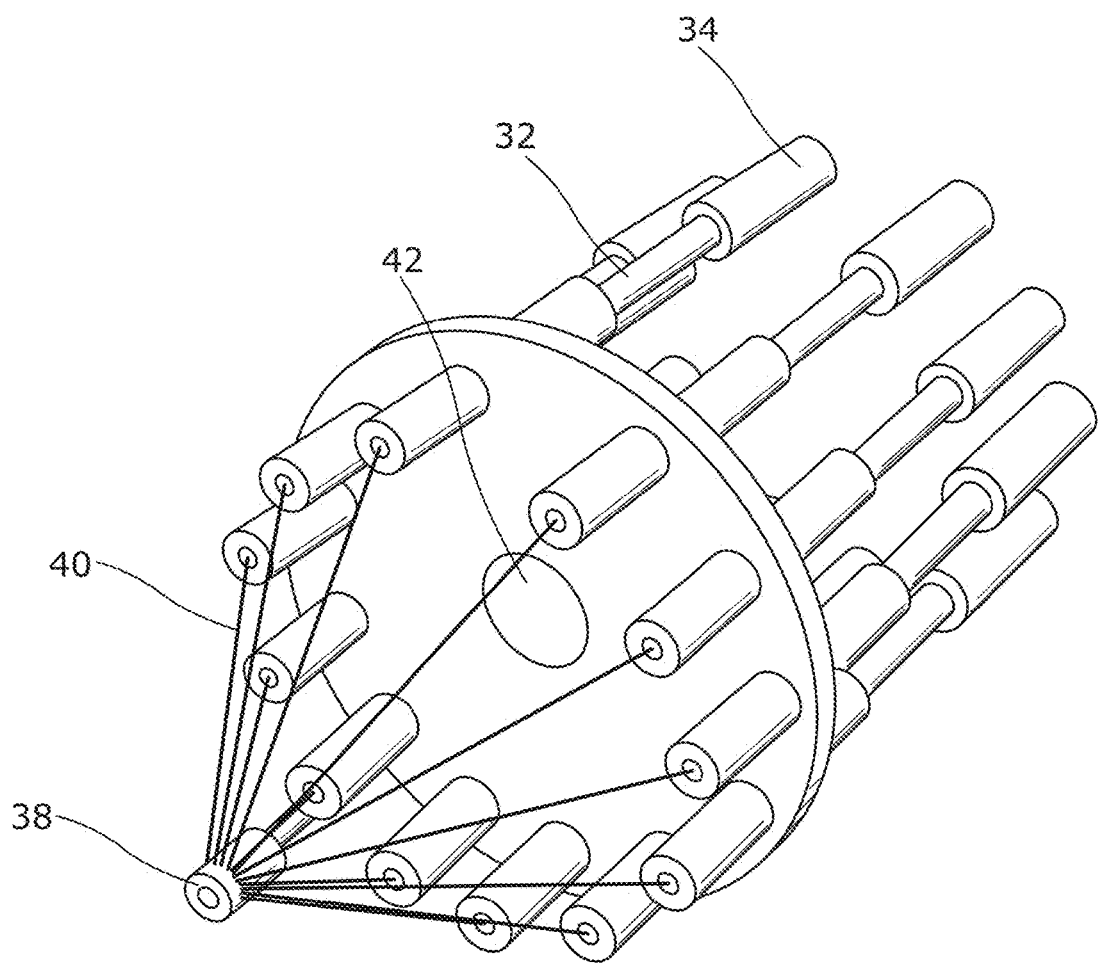
FIG. 4A shows an exploded perspective view and FIG. 4B a side view of an end plate having a plurality of electrodes disposed therein.
Figure 4B:
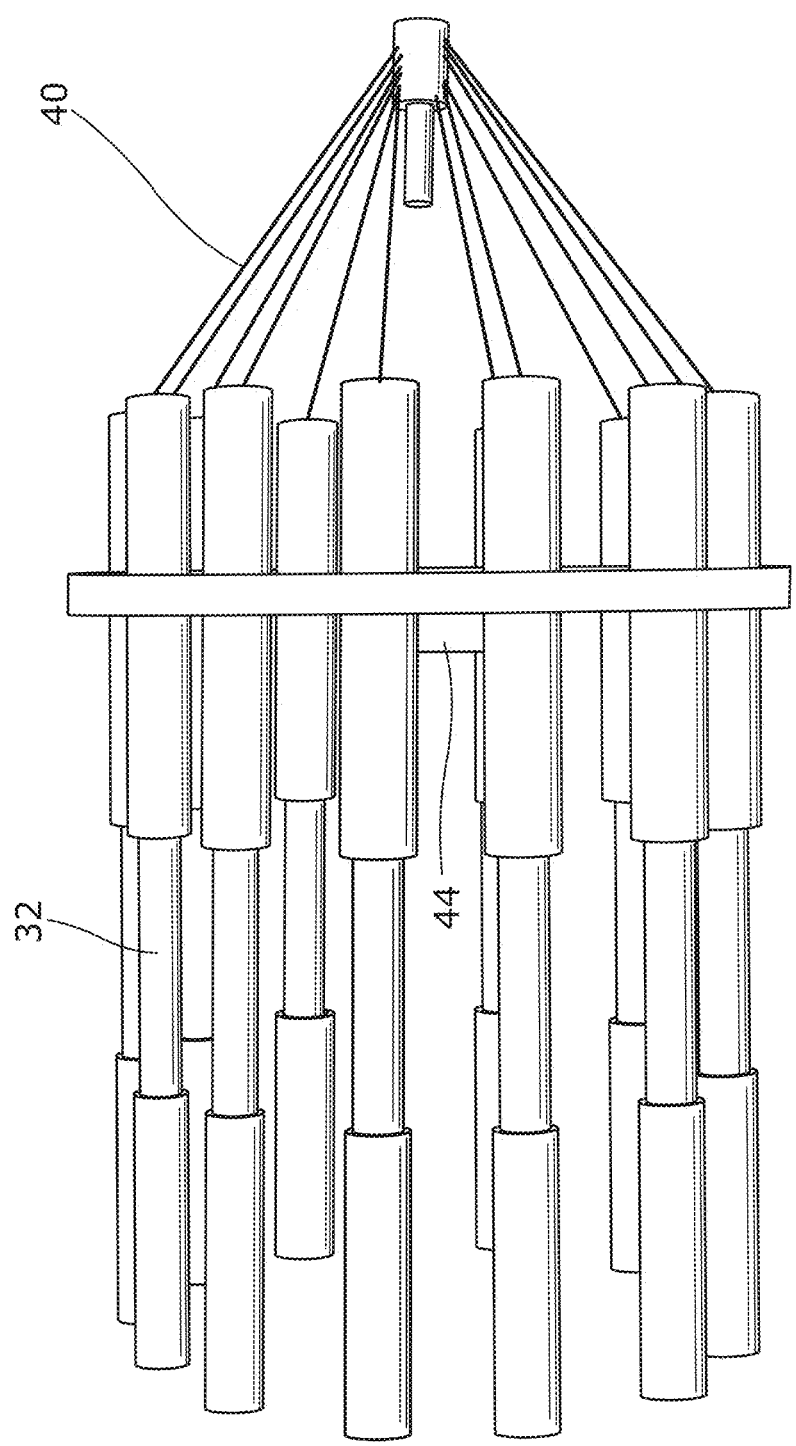
Figure 5:
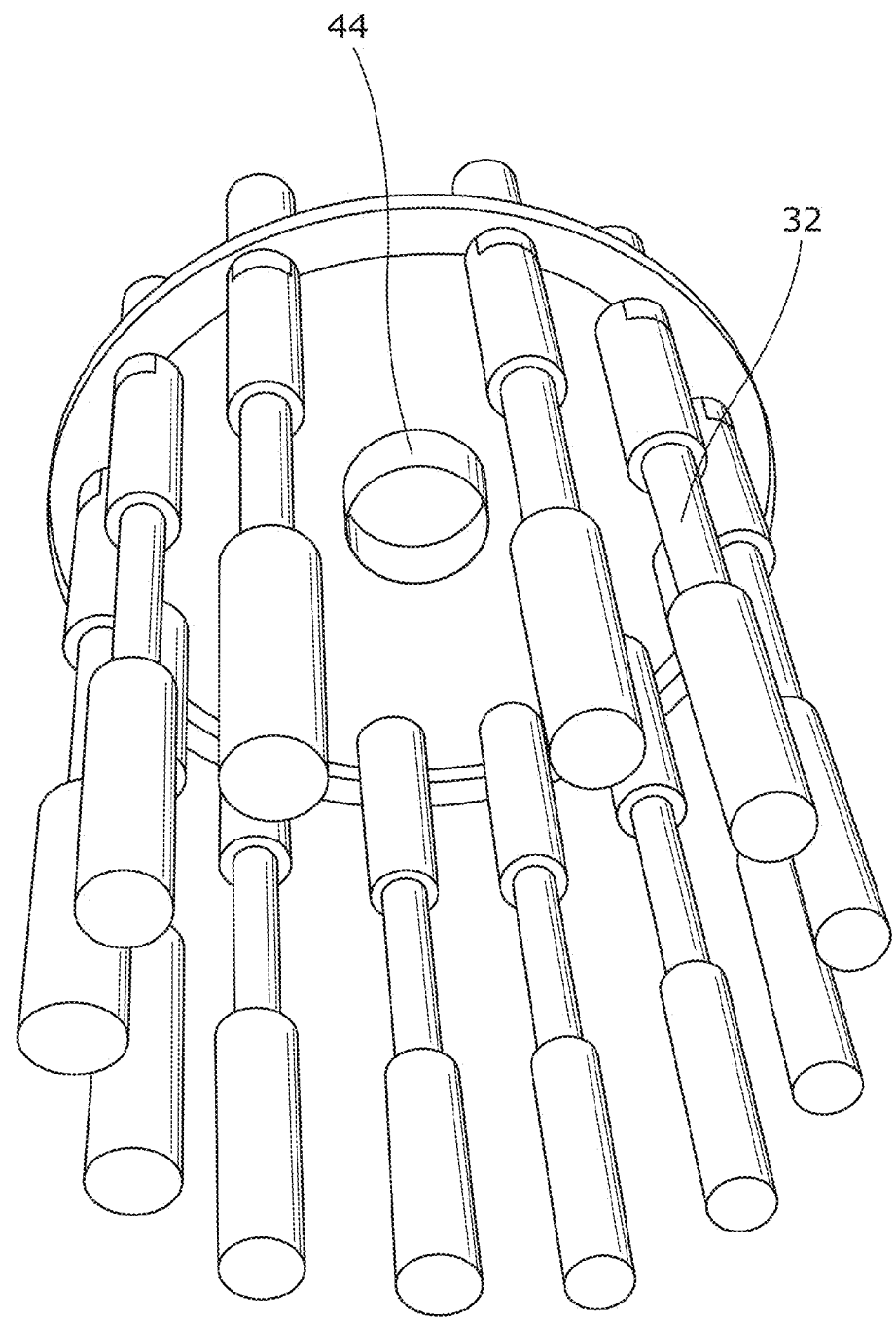
FIG. 5 is a perspective front view of an end plate having electrodes disposed therein.

The supply and removal of gases to and from the treatment chamber 10 will now be described with particular reference to FIGS. 4A, 4B and 5 which show a gas inlet module 38 (also shown in FIG. 3) which is in gas conducting connection with a plurality of gas inlet lines 40. Each gas inlet line 40 is connected to an electrode 32. Each electrode 32 is hollow, having an internal gas conducting conduit (not shown) leading to a gas outlet aperture at the distal end of each electrode 32 (not shown). The gas inlet module 38 is housed in the first frusto-conical section 22, and is supplied with the gases to be used during plasma processing from one or more external gas supply sources (not shown). The supply of gas can be controlled using known means such as mass flow controllers.

The first end plate 28 has an exhaust port 42 formed therein. As shown in FIGS. 4B and 5, a filter 44 is disposed in the exhaust port 42. The exhaust port 42 is in connection with a pumping arrangement (not shown) which is used to create a vacuum in the treatment chamber and to pump away process gases in a manner which is well-known to the skilled reader.

Rotatable drum chambers are available commercially and may be adapted in order to produce apparatus of the invention. For example, a rotating drum plasma reactor is produced commercially by Diener Electronic GmbH & Co. KG, D-72224 Ebhausen, Germany having the product name "Tetra 500"®. This apparatus may be adapted in accordance with the invention, for example by providing the plurality of electrodes described above.

In use, a charge of the particles to be processed is disposed on the floor of the drum 20. The chamber is evacuated to a desired baseline pressure, and the process gas or gases are introduced into the treatment chamber 20 through the electrodes 32. The treatment chamber 10 is rotated at a desired rotational speed. A plasma is generated at each electrode 32 in order to initiate processing of the particles. During the processing of the particles, the electrodes 32 are rotating, and this acts to continuously agitate the charge of particles in the treatment chamber. The particles may be physically transported through this agitation, for example through sideways displacement of the particles, or by way of the particles being thrown upwards the interior of the chamber. The scoops 36 can significantly assist in the process.

In the embodiment shown in FIGS. 1 to 5, glow discharge plasmas are formed at each electrode 32. RF power is applied to electrode 32. A convenient RF frequency such as 13.56 MHz may be used. The electrodes 32 thereby act as working electrodes in a glow discharge system. A counter-electrode is provided, and conveniently this can be the inner surface of the drum 20 which might be coated with a conductive ceramic such as boron silicate glass. The RF power establishes a negative DC bias voltage on the electrodes 32 which thereby act as cathodes in the flow discharge system. It is also possible to use other methods to obtain glow discharge plasmas, such as through the application of a DC voltage through electrodes 32. Other forms of plasma might be utilised instead.

Localised plasmas are generated around each electrode 32, but the process conditions are selected so that these plasmas are discrete and separated from one another. In this way, each electrode is surrounded with a plasma halo which contains clouds of energetic electrons, UV photons, ions and, typically, reactive neutral species. This rich plasma can be used to perform one or a number of useful particle treatment steps. The use of multiple electrodes increases the number of electron clouds and other useful species associated with the plasmas, and this has beneficial effect on processing efficiency. Additionally, the use of the electrodes to agitate the particles to be treated can also have a beneficial effect on processing efficiency as well as improving the results achieved.

The apparatus may be used to exfoliate particles of graphite to produce a graphene containing material. GNP may be produced in this way. This is achieved through exfoliation, and typically a high plasma power is utilised, at least in the initial stages of the process, to facilitate ion bombardment and ion intercalation of the target material. Effective bombardment and intercalation causes layers of the target material such as graphite to exfoliate. Without wishing to be limited by a particular theory or conjecture, it is believed that a result of this is that a nett negative charge is imparted onto the exfoliated layers so that they can push off from each other. This charge overcomes attractive van der Waals' forces, thereby retarding the usual inclination of the particles produced by the exfoliation to reagglomerate. A plasma formed in oxygen is effective in producing exfoliation to provide graphene containing material such as GNP. The process can be used more generally to exfoliate and/or deagglomerate fibres and sheet material.

An oxygen plasma is also an advantageous means of cleaning particles. Nanoparticles such as CNTs and GNPs are conveniently cleaned by an oxygen plasma. Representative but non-limiting process conditions are a temperature of less than 100° C. with a plasma power of 120 W for around thirty minutes at a pressure of 1.5 Torr (200 Pa). The present inventors have recognised that the particles to be treated may contain defects, and also that processes such as cleaning can introduce further defects. Very advantageously, it has been realised that effective repair of defects can be achieved through plasma processing using apparatus of the invention. Effective repair can be achieved using a PECVD process involving a plasma in pure methane. Representative conditions are a plasma power of 100 W and a chamber gas pressure of 0.2 Torr (27 Pa). GNPs of excellent crystallinity have been obtained following repair treatment in a methane plasma. The plasma process can be terminated with nitrogen prior to vacuum packing to preserve the cleanliness of the processed particles.

Figure 6A:
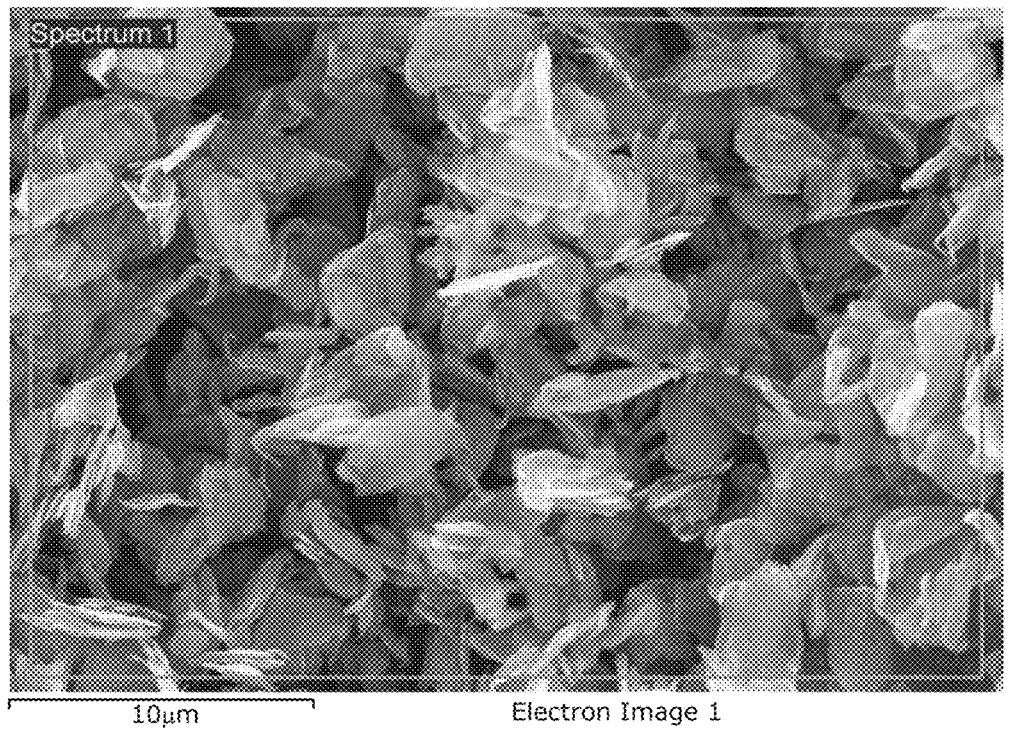
FIG. 6A shows an electron microscope image and FIG. 6B an EDX spectrum of GNP treated using the invention.
Figure 6B:
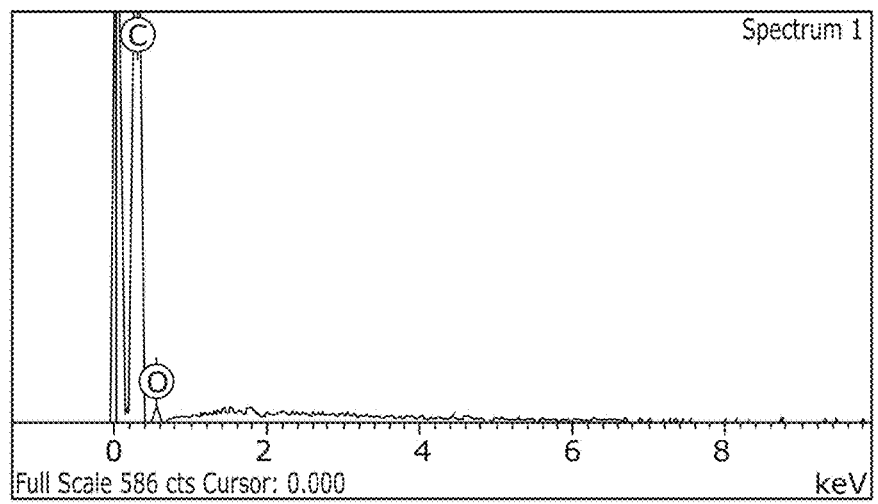

Experiments were performed on GNP. Mined graphite from Sri Lanka was size reduced in a mechanical mill and introduced to a treatment chamber of the type shown in FIG. 1. An oxygen plasma was used to exfoliate layers from the graphite to produce GNP. The oxygen plasma also acted as a cleaning plasma and as a functionalising plasma. Following the oxygen plasma treatment, the GNP was subjected to a methane treatment to repair defects in the GNP. FIG. 6A shows an electron microscope image of the GNP after cleaning and repair. FIG. 6B is an EDX spectrum. Table 1 shows the associated elemental analysis.

TABLE 1

| Elemental Analysis of GNP | | |
| --- | --- | --- |
| Element | Weight % | Atomic % |
| C | 95.01 | 96.20 |
| O | 4.99 | 3.80 |

The results indicate that graphene nanoplatelets of extremely high purity and crystallinity have been produced using the invention. The functionalisation with oxygen mainly produces—COOH functionalities, which are extremely dense on the GNP. Although the GNP has been produced from mined graphite, there are no signs of mined contaminants such as metals, sand or chalk. This indicates that the cleaning part of the treatment cycle has worked extremely well.

A further possibility when treating particles in accordance with the invention is to remove treated particles from the multi-electrode treatment chamber to a final stage treatment chamber using vacuum transfer or other appropriate means. The final treatment chamber may be used to facilitate high temperature processing which will provide additional treatment options, for example for decorating the particles with a desired material. The final stage treatment may be a microwave induced plasma treatment. In these embodiments, the final treatment chamber may have glass windows and an inner surface coated with a ceramic or glass. Appropriate wave guides would be used to couple microwave energy into the chamber through the windows. The final treatment chamber can be configured to rotate in order to agitate the particles. In another alternative, a final treatment step such as this can be performed in the original treatment chamber. In these embodiments, the original treatment chamber is provided with microwave means to generate the microwave induced plasma. The multi-electrode array can be used for this purpose if the electrodes are made from suitable materials such as a conductive glass, for example boron silicates.

A potential problem during processing is electrical shorting of the electrodes. This can be at least ameliorated by reducing the plasma power as the processing continues. The likelihood of shorting occurring increases if the material volume increases during processing which is likely to occur if deagglomeration and/or disaggregation occurs. One approach which may be adopted is to reduce the plasma power as the volume of the treated particles increases. For example, an inverse relationship between the volume of the treated particles and the applied plasma power, or another relationship determined by routine investigation may be followed.

The invention claimed is:

1. A method of treating carbon nanoparticles by disaggregating, deagglomerating, exfoliating, cleaning, functionalising, doping, decorating and/or repairing said carbon nanoparticles, wherein the carbon nanoparticles have a structure and said repairing includes repairing defects which are mono or multiple vacancies formed by loss of one or more atoms from the structure of the carbon nanoparticles, in which:
   the carbon nanoparticles are introduced into and subjected to plasma treatment in a treatment chamber containing a plurality of electrodes which project therein, wherein glow discharge plasma is continuously generated by each electrode of the plurality of electrodes by applying DC, AC or RF power to said each electrode of the plurality of electrodes, said each electrode of the plurality of electrodes thereby acting as a working electrode, and a gas or gaseous mixture is introduced into the chamber from said each electrode of the plurality of electrodes to sustain the glow discharge plasma generated by said each electrode of the plurality of electrodes; and
   said each electrode of the plurality of electrodes is continuously moved during the plasma treatment to agitate the carbon nanoparticles, thereby disaggregating, deagglomerating, exfoliating, cleaning, functionalising, doping, decorating and/or repairing said carbon nanoparticles.

2. A method according to claim 1 in which plasma is formed in a localised region around said each electrode of the plurality of electrodes.

3. A method according to claim 1 in which the electrodes are moved at a speed which is varied during the course of the plasma treatment so as to control the interaction between the plasma generated by the electrodes and the nanoparticles.

4. A method according to claim 1 in which the treatment chamber contains a plurality of scoops which are moved during the plasma treatment to displace the nanoparticles away from the plasma.

5. A method according to claim 4 in which the scoops form part of, or are attached to, at least some of the electrodes.

6. A method according to claim 1 in which at least a portion of the treatment chamber is rotated thereby causing the electrodes to move during the plasma treatment.

7. A method according to claim 1 in which, following the plasma treatment using the plasma generated by the electrodes, a particulate product of said plasma treatment undergoes a further treatment using a microwave induced plasma.

8. A method according to claim 7 in which the treatment chamber is provided with microwave means to generate the microwave induced plasma.

9. A method according to claim 1 in which, following the plasma treatment using the plasma generated by the electrodes, a particulate product of said plasma treatment is transferred from the treatment chamber to a second chamber where the particulate product undergoes a finishing treatment.

10. A method according to claim 9 in which the finishing treatment is a plasma treatment, such as a microwave induced plasma treatment.

11. A method according to claim 9 in which the second chamber is moved during the finishing treatment to agitate the particulate product, such as by rotating the second chamber.

12. A method according to claim 1 in which the carbon nanoparticles are fullerenes.

13. A method according to claim 12 in which the fullerenes are carbon nanotubes (CNTs).

14. A method according to claim 1 in which the carbon nanoparticles are graphene containing nanoparticles.

15. A method according to claim 14 in which the graphene containing nanoparticles are graphene nanoplatelets (GNPs).

* * * * *